(12) United States Patent
Kunz et al.

(10) Patent No.: US 11,739,891 B2
(45) Date of Patent: Aug. 29, 2023

(54) ILLUMINATION DEVICE

(71) Applicant: SEOUL SEMICONDUCTOR EUROPE GMBH, Munich (DE)

(72) Inventors: Sergej Kunz, Munich (DE); Victor Goldrin, Munich (DE)

(73) Assignee: SEOUL SEMICONDUCTOR EUROPE GMBH, Munich (DE)

( * ) Notice: Subject to any disclaimer, the term of this patent is extended or adjusted under 35 U.S.C. 154(b) by 0 days.

(21) Appl. No.: 17/681,465

(22) Filed: Feb. 25, 2022

(65) Prior Publication Data

US 2022/0178503 A1 Jun. 9, 2022

Related U.S. Application Data

(63) Continuation of application No. PCT/EP2020/074021, filed on Aug. 27, 2020.

(30) Foreign Application Priority Data

Aug. 27, 2019 (EP) ..................... 19193848

(51) Int. Cl.
*F21K 9/69* (2016.01)
*F21V 23/00* (2015.01)
(Continued)

(52) U.S. Cl.
CPC .............. *F21K 9/69* (2016.08); *F21V 23/003* (2013.01); *G02B 27/30* (2013.01); *F21S 8/085* (2013.01);
(Continued)

(58) Field of Classification Search
CPC .......... F21K 9/69; F21V 23/003; G02B 27/30
See application file for complete search history.

(56) References Cited

U.S. PATENT DOCUMENTS 7,506,998 B2 * 3/2009 Ansems ................ G02B 6/002
362/245
7,717,599 B2 * 5/2010 Grace ................ G02B 27/0955
362/555
(Continued)

FOREIGN PATENT DOCUMENTS

EP 3141805 A1 3/2017
EP 3470728 A1 4/2019
(Continued)

OTHER PUBLICATIONS

International Search Report for International Application No. PCT/EP2020/074021, dated Oct. 16, 2020, 3 pages.

*Primary Examiner* — Bryon T Gyllstrom
(74) *Attorney, Agent, or Firm* — Perkins Coie LLP

(57) ABSTRACT

An Illumination device includes light emitting devices and an optical system for collimating light emitted by the light emitting devices. A first group of the light emitting devices are arranged in a first array having first gaps, and a first optical system is arranged near the first group of light emitting devices. At least one second group of the light emitting devices are arranged in a second array, and the second array has second gaps. The second optical system is arranged near the second group of light emitting devices. The first and second optical systems are arranged so that, in a distance from the illumination device, light emitted by the first group of light emitting devices, collimated by the first optical system, and light emitted by the second group of light emitting devices, collimated by the second optical system, are superimposed to form a gap-free illumination field.

18 Claims, 9 Drawing Sheets

(51) Int. Cl.
    *G02B 27/30*      (2006.01)
    *F21Y 103/10*     (2016.01)
    *F21Y 115/10*     (2016.01)
    *F21S 41/151*     (2018.01)
    *F21S 8/08*       (2006.01)

(52) U.S. Cl.
    CPC ......... *F21S 41/151* (2018.01); *F21Y 2103/10* (2016.08); *F21Y 2115/10* (2016.08)

(56) References Cited

U.S. PATENT DOCUMENTS

| | | | | |
|---|---|---|---|---|
| 7,789,531 B2* | 9/2010 | Duong | ................... | H01L 33/20 362/257 |
| 8,016,443 B2* | 9/2011 | Falicoff | ................ | F21V 7/0025 362/310 |
| 8,251,538 B2* | 8/2012 | Samber | ................ | H01L 33/507 362/249.02 |
| 8,267,553 B2* | 9/2012 | Liang | ..................... | F21V 13/04 362/329 |
| 8,455,908 B2* | 6/2013 | Welch | ................ | H01L 25/0753 257/431 |
| 8,456,107 B2* | 6/2013 | Salm | ...................... | F21V 14/06 315/307 |
| 9,275,979 B2* | 3/2016 | Tong | ...................... | H01L 33/60 |
| 11,083,059 B2* | 8/2021 | Francis | ................... | H01L 33/50 |
| 2011/0002137 A1 | 1/2011 | Takeda et al. | | |
| 2013/0107518 A1 | 5/2013 | Boyer et al. | | |
| 2014/0285997 A1 | 9/2014 | Nitta et al. | | |
| 2021/0226106 A1* | 7/2021 | Yun | ...................... | H01L 33/405 |
| 2022/0178503 A1* | 6/2022 | Kunz | ................... | H01L 25/0753 |
| 2022/0368112 A1* | 11/2022 | Hikmet | .................. | F21K 9/64 |

FOREIGN PATENT DOCUMENTS

| | | |
|---|---|---|
| EP | 3517827 A1 | 7/2019 |
| WO | 2009104067 A1 | 8/2009 |

\* cited by examiner

ILLUMINATION DEVICE

CROSS-REFERENCE OF RELATED APPLICATIONS AND PRIORITY

The Present Application is a continuation of the International Application No. PCT/EP2020/074021 filed Aug. 27, 2020, which claims priority to EP Patent Application No. 19193848.9 filed Aug. 27, 2019, the disclosure of which is incorporated by reference as if fully set forth herein.

TECHNICAL FIELD

The present disclosure relates to illumination devices. More specifically, the present disclosure relates to illumination devices including a plurality of LED light source devices.

BACKGROUND

LED based illumination devices have replaced conventional light source devices, e.g., incandescent light source devices, in many applications. Low energy consumption, long lifetime, and high variability in color and color temperature make LED based illumination devices a preferred choice for most applications.

For technical reasons, LED based illumination devices usually include a plurality of individual light emitting devices, each including an LED light source device. The plurality of individual light emitting devices are commonly arranged in arrays, e.g., linear arrays.

In some applications, directional illumination is required. For directional illumination, light emitted by the plurality of light emitting devices is collimated by optical systems, such that the light from each of the light emitting devices is shaped into a light beam with a narrow cone angle. A possible cone angle of a light beam can be 2°.

LED light source devices used in illumination devices usually include an LED chip for emitting excitation light, and a phosphor body covering the LED chip for converting excitation light into illumination light of a predetermined color temperature. As LED chips emit light within a narrow wavelength bandwidth, such light may not be well suited for illumination purposes. Therefore, phosphors are used to convert some or all of the light emitted by the LED chip into illumination light of a predetermined color temperature. Color temperature can be determined based on specific application of an illumination device.

When a plurality of LED light source devices are placed in close proximity to each other, excitation light of one LED chip can travel into the phosphor body of a neighboring LED light source device. This may affect contrast available by selectively activating or deactivating individual LED light sources. In order to achieve a desirable contrast, e.g., about 200:1 or higher, known LED light sources therefore further include a light blocking layer on the lateral surfaces of the LED chip and/or the phosphor body. The light blocking layer may include silicon mixed with titanium dioxide particles. The light blocking layer is sometimes also referred to as side coating.

Due to the light blocking layers, arrays of LED light sources always include dark surface portions interposed between light emitting surface portions, irrespective of how tight the individual LED light sources are packed in the array. Due to further technical constraints, e.g., handling of individual LED light sources during manufacturing, LED light sources may be packed in an array with gaps. Packing LED light sources in an array with a reduced gap may be related to heat management. When light emitted by an array of LED light sources, which includes dark surface portions interposed between light emitting surface portions, is collimated by an optical system, the resulting illumination field has a comb-like structure with individual beams, emanating from the individual LED light sources, separated by gaps. Such illumination fields can be disadvantageous, e.g., when used for illumination of a road by vehicle headlights or streetlights, or for illumination of a workspace by a room light.

The gaps in the illumination field can be reduced or even completely removed by modification of the optical system for collimation of the light. However, such modifications may increase complexity of the optical system and cost of the illumination device.

SUMMARY

In view of above, it is desirable to have an illumination device including a plurality of LED light source devices arranged in an array, which provides for a light field with improved homogeneity.

It is desirable to have an illumination device including a plurality of LED light source devices arranged in an array, and with an optical system of reduced complexity.

It is also desirable to have an illumination device including a plurality of LED light source devices arranged in an array, which provides for improved heat management.

Some or all of the above objectives are achieved by illumination devices according to the appending claims.

In one or more embodiments according to the present disclosure, an illumination device is provided with a plurality of light emitting devices and an optical system for collimating light emitted by the plurality of light emitting devices. Each of the light emitting devices includes an LED light source device having an LED chip for emitting excitation light, a phosphor body covering the LED chip for converting excitation light into illumination light of a predetermined color temperature, and a light blocking layer arranged on the lateral surfaces of the LED chip and/or the phosphor body. A first group of the light emitting devices is arranged in a first linear array having first gaps, and a first optical system is arranged near the first group of light emitting devices. An optical axis of the first optical system is substantially orthogonal to the first linear array. At least one second group of the light emitting devices is arranged in at least one second linear array parallel to the first linear array, having second gaps, at least one second optical system is arranged near the at least one second group of light emitting devices, an optical axis of the second optical system being substantially orthogonal to the second linear array, and the first and at least one second optical systems are arranged so that, in a predetermined distance from the illumination device, light emitted by the first group of light emitting devices, collimated by the first optical system, and light emitted by the at least one second group of light emitting devices, collimated by the at least one second optical system, superimpose to form a substantially gap-free illumination field.

Instead of using a complicated optical system for reducing the gaps in the illumination field, the inventive illumination device uses two optical systems, each providing a partial illumination field with gaps due to the gaps between LED light source devices in the respective arrays. The partial illumination fields superimpose so that the light beams of one partial illumination field meet the gaps of the other partial illumination field, and vice versa. The resulting illumination field can be substantially gap-free.

While reference is made to the resulting illumination field being substantially gap-free at the predetermined distance, it is understood that the resulting illumination field preferably remains substantially gap-free at distances greater than the predetermined distance.

Each of the LED light source devices may have a light emitting surface with a predetermined first width in the direction of the first or second array. Each of the gaps between neighboring LED light source devices may have a predetermined second width in the direction of the first or second array. The first and second width may be selected so that the distance between the light emitting surfaces of neighboring LED light source devices substantially equal an integer multiple of the first width. The distance between the light emitting surfaces of neighboring LED light source devices may substantially equal the first width.

In at least one variant, the optical axes of the first and second optical system may be substantially parallel to each other. The position of the light source devices of the second group of light source devices relative to the optical axis of the second optical system may be offset with respect to the position of the light source devices of the first group of light source devices relative to the optical axis of the first optical system.

In another variant, the first and second arrays may be arranged along a base line parallel to the first and second arrays. The first and second arrays may be arranged along a base line orthogonal to the first and second arrays.

In another variant, the first width may between 0.5 mm and 1 mm.

In another variant, the first and second optical systems may include positive lenses. The first and second arrays may be substantially arranged in the focus planes of respective positive lenses.

In another variant, the first and second groups of light emitting devices may be placed on first and second printed circuit boards. The first and second groups of light emitting devices may be placed on a common printed circuit board.

In another variant, the illumination device may further include a control unit capable of selectively activating/deactivating individual light emitting devices of the plurality of light emitting devices.

In another variant, the illumination device may be a vehicle headlight, and the predetermined distance from the illumination device may be between 20 m and 30 m, preferably 25 m. The illumination device may be a streetlight, and the predetermined distance from the illumination device may be between 3 m and 6 m. The illumination device may be a room light, and the predetermined distance from the illumination device may be between 2 m and 4 m.

BRIEF DESCRIPTION OF THE DRAWINGS

FIG. 6A illustrates a light field emitted by a first array of the illumination device;

FIG. 6B illustrates a light field emitted by a second array of the illumination device; and FIG. 6C illustrates a light field emitted by the first array and the second array of the illumination device.

FIG. 7A illustrates at least two arrays of the illumination device placed on separate circuit boards;

FIG. 7B illustrates at least two arrays of the illumination device placed on a common circuit board; and FIG. 7C illustrates another arrangement of the illumination device on a circuit board.

FIG. 8A illustrates a combination of two arrays where each array includes two rows of the LED light source devices in a first arrangement; and FIG. 8B illustrates that light of respective LED light source devices merges into a seamless light field having two rows of light beams.

FIG. 9A illustrates a combination of two arrays where each array includes three rows of LED devices in a second arrangement; and FIG. 9B illustrates that light of respective LED light source devices merges into a seamless light field having three rows of light beams.

FIG. 10A illustrates a combination of two arrays where each array includes four rows of LED devices in a third arrangement; and FIG. 10B illustrates that light of respective LED light source devices merges into a seamless light field having four rows of light beams.

DETAILED DESCRIPTION

Possible embodiments of the invention will now be described in detail with reference to exemplary drawings. The drawings and the embodiments described hereafter only serve for better understanding of the invention, without limiting the scope of the invention to the exact details of the described embodiments. The scope of the invention is to be determined by the appended claims.

Figure 1:
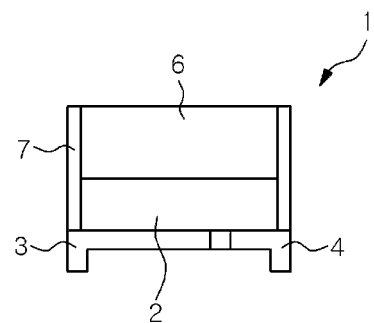
FIG. 1 illustrates an LED light source device according to one or more embodiments of the present disclosure.

FIG. 1 shows a cross-sectional view of an LED light source device 1. The LED light source device 1 includes an LED chip 2 connected to a first lead frame 3 with an anode side of the LED chip 2. A cathode side of the LED chip 2 is connected to a second lead frame 4. In other forms, the lead frames 3 and 4 may be omitted, and solder contacts may be directly provided on a surface of the LED chip.

The LED chip 2 is embedded in a phosphor body 6. The phosphor body 6 serves to convert narrow-band-width light emitted by the LED chip 2 into illumination light of a desired color temperature. The phosphor body 6 can also serve to mechanically connect first and second lead frames 3 and 4.

In some forms, the phosphor body 6 can include a transparent resin with immersed phosphor particles (not shown). The immersed phosphor particles can include one or more different types of phosphor, and are selected to provide a desired color temperature of the illumination light.

The lateral sides of the phosphor body 6 are surrounded by a light blocking layer, also referred to as reflector layer 7, as shown in FIG. 1. The reflector layer 7 is provided so that excitation light and/or illumination light do not exit the LED light source device 1 at the lateral sides thereof and enter into neighboring LED light source devices. Such cross-illumination may reduce available contrast of an illumination device using the LED light source devices, which is undesirable.

The reflector layer 7 may include silicon with embedded $TiO_2$ particles. It is sometimes also referred to as side coating.

Due to the above-described structure of LED light source devices, the LED light source devices include a light emitting surface portion surrounded by a surface which does not emit light. Only by way of example, the light emitting surface portion has a size of about 1 $mm^2$ or less, for example between 0.5 $mm^2$ and 1 $mm^2$. The reflector layer 7 may have a thickness of about 0.01 mm or less.

Figure 2:
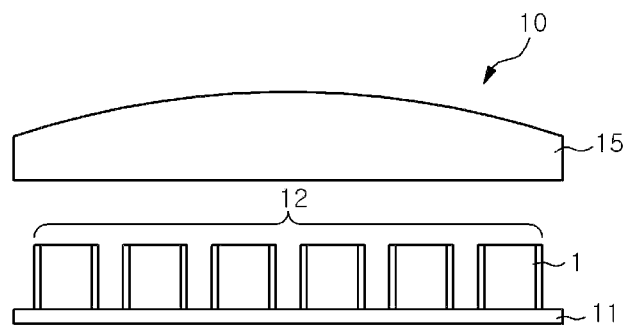
FIG. 2 illustrates an illumination device including the LED light source device shown in FIG. 1.

FIG. 2 depicts an illumination device 10 including a plurality of LED light source devices 1 arranged on a circuit board 11 in a linear array 12. A lens 15 is provided for collimating the light emitted by the individual LED light source devices 1. Therefore, the light emitting surface portions of the LED light source devices 1 are approximately placed in focal plane of the lens 15. While the lens 15 is depicted as a single lens, the present disclosure is not limited thereto and a plurality of lenses may form an optical system. Such an optical system may e.g., provide for color correction of the illumination light, length and/or weight reduction of the optical system, or both. The optical system may include reflective elements instead of or in addition to lenses.

Figure 3:
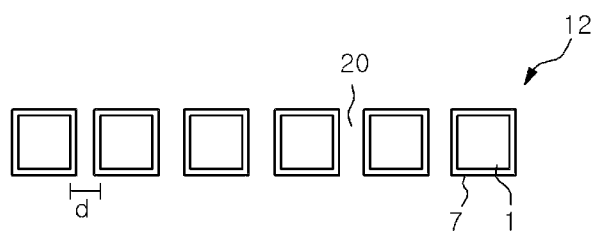
FIG. 3 illustrates an array of light emitting devices.

FIG. 3 depicts an array 12 of LED light source devices 1 in a plan view. The individual LED light source devices 1 are positioned to leave gaps 20 between neighboring LED light source devices 1. The gaps 20 are arranged for several reasons.

One reason is that it is difficult to place the LED light sources 1 without gaps 20 in an automated process, as each automated process may be configured to provide for positional tolerances. Another reason is that the gaps 20 provide for dissipation of heat created in the individual LED light source devices 1. A further reason may be that lead frames of neighboring LED light source devices are configured to have a minimum distance to avoid short-circuits.

As a consequence, the light emitting surface portions of neighboring LED light source devices 1 in the array 12 are separated by a distance "d", which is equal to the width of a gap 20 plus double width of a reflector layer 7. The double width of the reflector layer 7 includes a width of the reflector layer 7 of one LED light source device 1 and a width of the reflector layer 7 of a neighboring LED light source device thereof.

Figure 4:
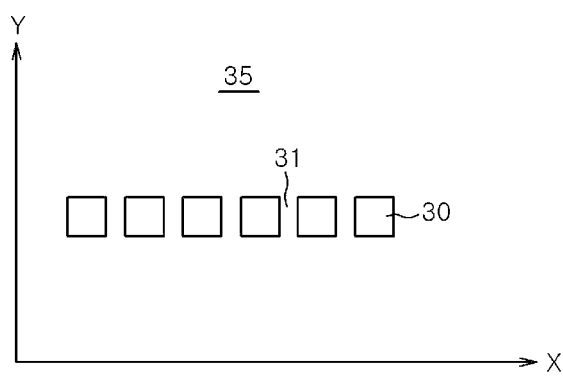
FIG. 4 illustrates a light field emitted by the illumination device of FIG. 2.

A possible light field emitted by the illumination device of FIG. 2 is depicted in FIG. 4. The light field is defined by the projection of the light emitted by individual LED light source devices 1 through the lens 15 onto a reference plane 35 having X-axis and Y-axis. For automotive applications, the reference plane may be 25 meters away from the illumination device.

It can be seen that the light field includes several light beams 30 separated by dark spaces 31. The dark spaces 31 can be seen as projections of the gaps 20 and the reflector layers 7, which separate the light emitting surface portions of the LED light source devices 1.

In some forms, the lens 15 may be modified so that the dark spaces 31 are reduced. Such modifications may come with increased cost of the lens 15, although available contrast of the illumination device 10 may be maintained.

Figure 5A:
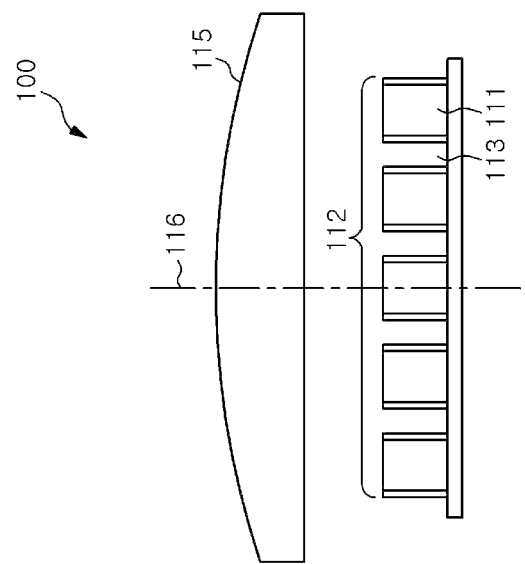
FIG. 5A illustrates an improved illumination device including a first group of LED light source devices arranged in a first array.
Figure 5B:
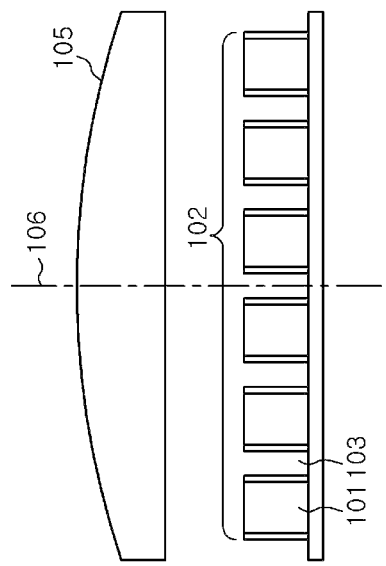
FIG. 5B illustrates the improved illumination device including a second group of LED light source devices arranged in a second array.

FIGS. 5A and 5B illustrate one embodiment of an illumination device 100 according to the present disclosure. FIG. 5A illustrates that the illumination device 100 includes a first group of LED light source devices 101 arranged in a first array 102. FIG. 5B illustrates that the illumination device 100 includes a second group of LED light source devices 111 arranged in a second array 112.

As shown in FIGS. 5A-5B, the first group of LED light source devices 101 is arranged in the first array 102, and individual LED light source devices 101 are separated from neighboring LED light source devices 101 by gaps 103. A first lens 105 is positioned near the first array 102 of LED light source devices, so that an optical axis 106 of the first lens 105 is approximately orthogonal to the first array 102, and the light emitting surfaces of the first group of LED light source devices 101 are positioned approximately on a focal plane of the first lens 105.

The first lens 105 can be a single lens or an optical system including more than one optical elements, as described above with reference to FIG. 2.

Figure 7A:
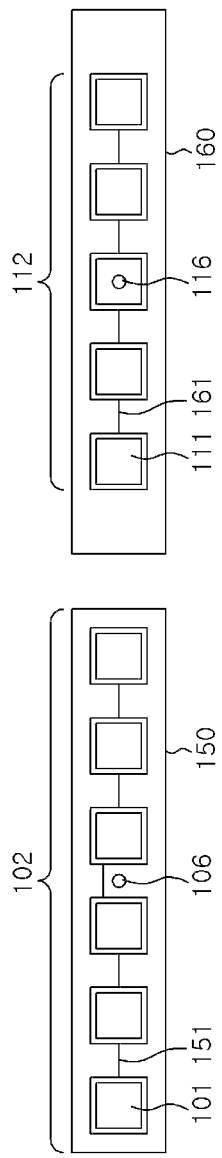
FIGS. 7A to 7C illustrates printed circuit boards, where.
Figure 7B:
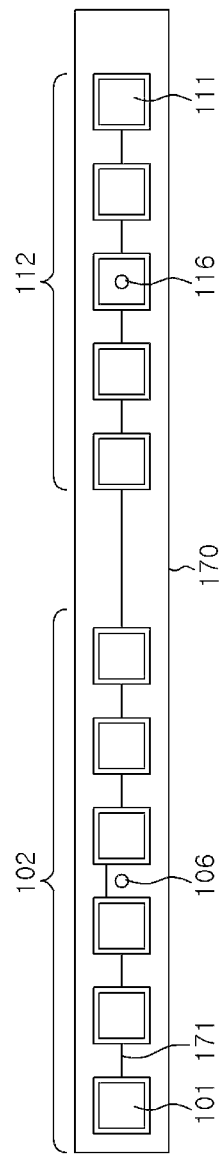

The second group of LED light source devices 111 is arranged in the second array 112 located adjacent to the first array 102. As shown in FIGS. 7A and 7B, the first array 102 and the second array 112 are positioned side by side on two separate circuit boards, or on the same circuit board.

In the second array 112, individual LED light source devices 111 are separated by gaps 113. A second lens 115 is positioned so that an optical axis 116 of the second lens 115 is approximately orthogonal to the second array 112, and the light emitting surfaces of the LED light source devices 111 are positioned approximately on a focal plane of the second lens 115.

Figure 6A:
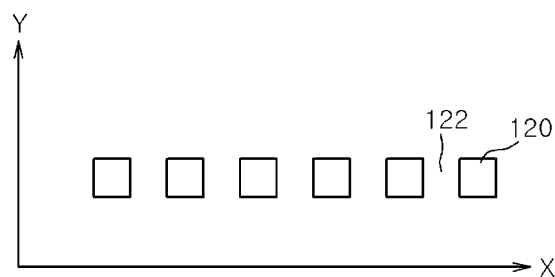
FIGS. 6A to 6C illustrate a light field emitted by the illumination device of FIG. 5, where.
Figure 6B:
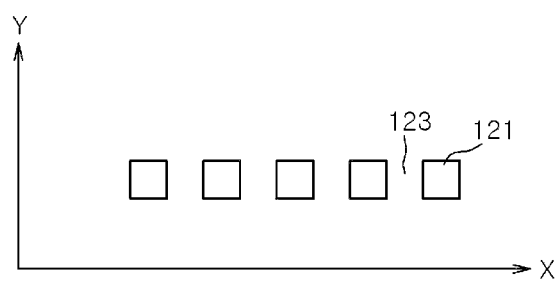
Figure 6C:
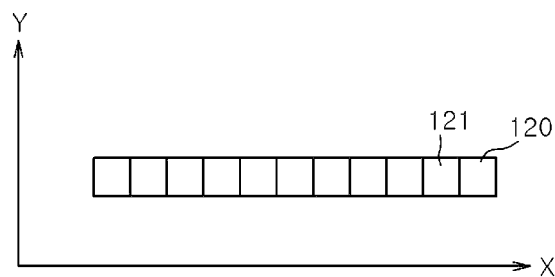

The light field emitted by the first array 102 of LED light source devices 101 is depicted in FIG. 6A. The light field emitted by the second array 112 of LED light source devices 111 is depicted in FIG. 6B. FIGS. 6A to 6C show projection plane, having X-axis and Y-axis, on which light beams emitted by the individual LED light source devices.

It can be seen that, similar to the light field depicted in FIG. 4, the light fields depicted in FIGS. 6A and 6B include light beams 120 and 121, corresponding to the light emitting surface portions of LED light source devices 101 and 111, separated by dark spaces 122 and 123. The dark spaces 122 and 123 correspond to the gaps 103 and 113 of the first and second arrays 102 and 112 and the non-light-emitting surface portions of the LED light source devices 101 and 111.

The gaps 103 of the first array 102 are dimensioned so that the light beams 120 of the light field emitted by the first array 102 fit in the dark spaces 122 of the light field emitted by the first array 102. The gaps 113 of the second array 112 are dimensioned so that the light beams 121 of the light field emitted by the second array 112 fit in the dark spaces 123 of the light field emitted by the second array 112. Therefore, the gaps 103 and 113 of the first and second arrays 102 and 112 are dimensioned so that the distance d between the light emitting surface portions of neighboring LED light source 101 and 111 devices equals to the width of the lights emitting surface portions of the LED light source devices 101 and 111. At the same time, the positions of the LED light source devices 101 in the first array 101 with respect to the first optical axis 106 are offset by about half the width of the light emitting surface portions, in light of the positions of the LED light source devices 111 with respect to the second optical axis 116.

The first and second arrays 102 and 112 and the first and second lenses 105 and 115 are positioned so that in an area of interest, the light fields emitted by the first and second arrays 102 and 112 overlap to form a continuous and seamless light field, which is depicted in FIG. 6C. The area of interest may include the predetermined distance and extend beyond the predetermined distance. In automotive application, where the predetermined distance may be 25 m according to photometric regulations, the area of interest may e.g., extend up to 100 m, up to 150 m, or even beyond that.

If the area of interest is very far away from the first and second lenses 105 and 115, the optical axes 106 and 116 can be approximately in parallel to each other. In other embodiments, the first and second optical axes 106 and 116 may form a sharp angle.

In the example depicted in FIGS. 5A and 5B, the illumination device 100 includes two arrays 102 and 112 of LED light source devices 101 and 111. Alternatively, the illumination device 100 may include more than two arrays of LED light source devices, and the gaps between neighboring LED light source devices may be dimensioned so that the distance between the light emitting surface portions of neighboring LED light source devices is equal to an integer multiple of the width of the light emitting surface portions.

The at least two arrays of LED light source devices may be placed on separate circuit boards, as depicted in FIG. 7A. The first array 102 of LED light source devices 101 is placed on a first circuit board 150 and can be connected by first connection wires 151. The second array 112 of LED light source devices 111 is placed on a second circuit board 160 and can be connected by second connection wires 161.

Placing the at least two arrays of LED light source devices on separate circuit boards facilitates easy adjustment of the relative positions of respective arrays.

The at least two arrays of LED light source devices may instead be placed on a common single circuit board, as depicted in FIG. 7B. Here, the first array 102 of LED light source devices 101 and the second array 112 of LED light source devices 111 are placed side by side on a single circuit board 170, connectable by connection wires 171.

Placing the at least two arrays of LED light source devices on a common circuit board facilitates easy handling of the respective arrays during manufacturing of the illumination device.

In the FIGS. 7A and 7B, the first and second arrays 102 and 112 are arranged along a base line (not shown) which is parallel to the first and second arrays 102 and 112.

Figure 7C:
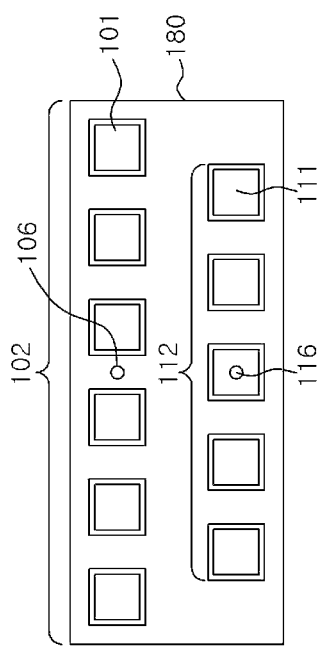

FIG. 7C depicts another arrangement of LED light source devices on a circuit board 180. Here, the first array 102 of LED light source devices 101 and the second array 112 of LED light source devices 111 are arranged along a base line (not shown) which is orthogonal to the respective arrays 102 and 112. In this case, the optical axes 106 and 116 of the lenses 105 and 115 (not shown) can be moved very close to each other. To avoid mechanical interference of the lenses, overlapping portions of the lenses may be cut away without significantly affecting optical performance. As an alternative to cutting lenses, a plurality of micro lenses may be used, each micro-lens collimating light emitted by a single LED light source device, or by a small group of LED light source devices.

In the above-described embodiments, the placement of individual LED light source devices in arrays with significant gaps leaves sufficient space for placing conductive connection structures for contacting the individual LED light source devices, and/or for placing heat management features like heat sinks, heat pipes or the like. Therefore, the overall performance and lifetime of illumination devices can greatly improve. While the previous examples disclose one-dimensional arrays of LED light source devices, two-dimensional arrays of LED light source devices can be employed to provide enhanced space resolution of an illumination device. Some examples of two-dimensional arrays are depicted in FIGS. 8A and 8B through FIGS. 10A and 10B. Embodiments of illumination devices shown in FIGS. 8A through 10B provide substantially gap-free illumination fields by arranging two or more arrays having a partial illumination field with gaps in various patterns and/or manners. Based on various arrangements, the partial illumination fields are superimposed so that the light beams of one partial illumination field meet the gaps of the other partial illumination field, and vice versa. The resulting illumination field can be substantially gap-free. The two or more arrays are associated and arranged with respective optical systems so that, in a predetermined distance from the illumination device, light emitted by a first group of light emitting devices, collimated by a first optical system, and light emitted by a second group of light emitting devices, collimated by a second optical system, are superimposed to form a gap-free illumination field.

Figure 8A:
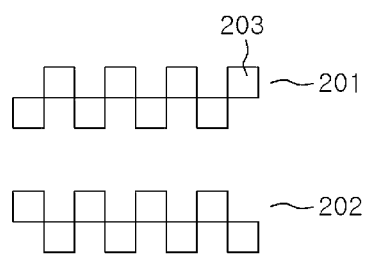
FIGS. 8A and 8B illustrate two-dimensional arrays of LED light emitting devices, where.
Figure 8B:
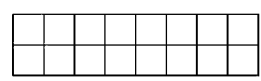

FIG. 8A depicts a combination of two arrays 201 and 202, where each array includes two rows of LED light emitting devices 203 in a first arrangement. FIG. 8B illustrates that the light of the respective LED light source devices 203 merges into a seamless light field having two rows of light beams.

Figure 9A:
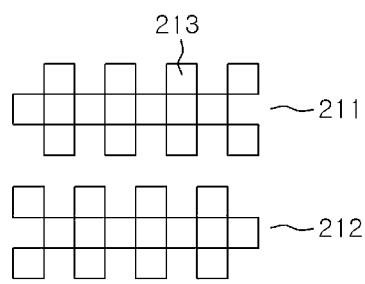
FIGS. 9A and 9B illustrate two-dimensional arrays of LED light emitting devices, where.
Figure 9B:
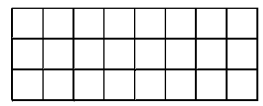

FIG. 9A depicts a combination of two arrays 211 and 212, where each includes three rows of LED light emitting devices 213 in a second arrangement. FIG. 9B illustrates that the light of the respective LED light source devices 213 merges into a seamless light field having three rows of light beams.

Figure 10A:
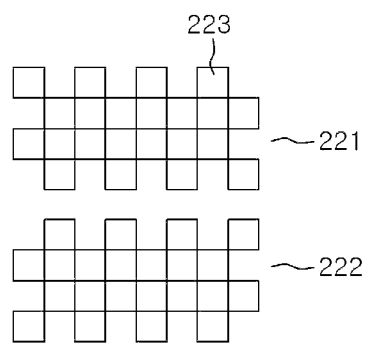
FIGS. 10A and 10B illustrate two-dimensional arrays of LED light emitting devices, where.
Figure 10B:
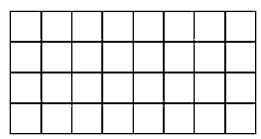

FIG. 10A depicts a combination of two arrays 221 and 222, where each includes four rows of LED light emitting devices 223 in a third arrangement. FIG. 10B illustrates that the light of the respective LED light source devices 223 merges into a seamless light field having four rows of light beams.

Instead of using a complicated optical system for reducing the gaps in the illumination field, the embodiments shown in FIGS. 8A, 9A and 10A use two optical systems, where each array or row of LED light emitting devices provides a partial illumination field with gaps. The partial illumination fields are superimposed so that the light beams of one partial illumination field meet the gaps of the other partial illumination field, and vice versa. The resulting illumination field can be substantially gap-free in a distance from the illumination device.

Figure 11:
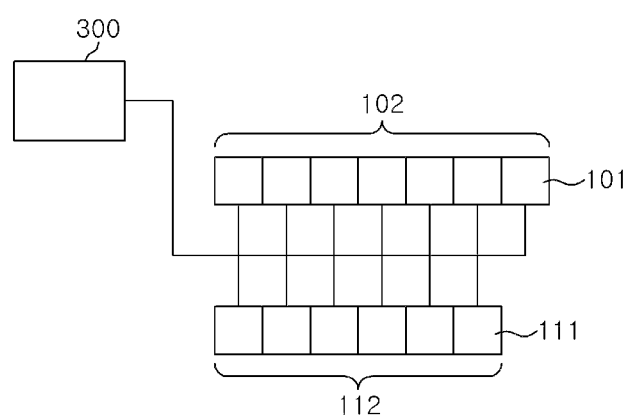
FIG. 11 illustrates another embodiment of an illumination device according to the present disclosure.

FIG. 11 depicts a further example of an illumination device including a first group of LED light source devices 101 arranged in a first array 102, at least one second group of LED light source devices 111 arranged in at least one second array 112, and a control device 300, configured for selectively activating, controlling, and/or deactivating individual LED light source devices 101 and 111.

Individual control of LED light source devices may be facilitated by individually providing a supply voltage to each LED light source device, while all LED light source devices are connected to a common ground conductor. Alternatively, all LED light source devices may be connected to a common supply voltage, and the driving current of each LED light source device may individually be controlled.

The illumination device shown in FIG. 11 enables selective control of brightness in individual sections of a light field corresponding to individual LED light source devices, which can be beneficial for several purposes.

In some embodiments, an illumination device according to this disclosure may be used as a vehicle headlight. In such application to the vehicle headlight, brightness control of individual sections of the light field may be used to avoid blinding of upcoming traffic or pedestrians, while providing optimal illumination of the driver's field of view. Instead of a driver's field of view, the headlights can be used to illuminate the field of view of machine vision systems in autonomous or machine-assisted driving vehicles.

Illumination devices according to this disclosure can be applied for an adaptive driving beam of a vehicle. Additionally, illumination devices according to the present disclosure may equally be applied for high-beam or low-beam illumination.

In a further possible application, an illumination device according to this disclosure may be used as a road light. In such application, brightness control of individual sectors of the light field may be used to provide adaptive brightness for different parts of the road like driveway and sidewalk parts.

In a different application, an illumination device according to this disclosure may be used as a room light. Brightness control may be used to provide customized illumination according to the preferences of a user.

The examples of the present disclosure have been described above as specific embodiments, but these are only examples, and the present disclosure is not limited thereto, and should be construed as having the widest scope according to the technical spirit disclosed in the present specification. A person skilled in the art may combine/substitute the disclosed embodiments to implement a pattern of a shape that is not disclosed, but it also does not depart from the scope of the present disclosure. In addition, those skilled in the art can easily change or modify the disclosed embodiments based on the present specification, and it is clear that such changes or modifications also belong to the scope of the present disclosure.

The invention claimed is:

1. An illumination device, comprising:
   a plurality of light emitting devices; and
   an optical system for collimating light emitted by the plurality of light emitting devices,
   wherein each of the plurality of light emitting devices comprises:
      an LED chip for emitting excitation light;
      a phosphor body covering the LED chip for converting the excitation light into illumination light of a predetermined color temperature; and
      a light blocking layer arranged on lateral surfaces of the LED chip, the phosphor body, or both;
   wherein:
   a first group of the light emitting devices is arranged in a first array having first gaps; and
   a first optical system is arranged relative to and in proximity to the first group of light emitting devices and configured to collimate first light emitted by the first group of light emitting devices, an optical axis of the first optical system being substantially orthogonal to the first array;
   at least one second group of the light emitting devices is arranged in a second array parallel to the first array, the second array having second gaps;
   at least one second optical system is arranged relative to and in proximity to the at least one second group of light emitting devices and configured to collimate second light emitted by the at least one second group of light emitting devices, an optical axis of the second optical system being substantially orthogonal to the second array; and
   the first and the at least one second optical systems are arranged so that, in a predetermined distance from the illumination device, the first light and the second light are superimposed to form a substantially gap-free illumination field, and
   a corresponding supply voltage is provided to each light emitting device in the first group of the light emitting devices and the at least one second group of the light emitting devices such that light emitting devices in the first group of the light emitting devices and the at least one second group of the light emitting devices are individually controlled.

2. The illumination device of claim 1, wherein each of the light emitting devices includes a light emitting surface with a first width in the first array;
   the first width is selected so that a distance between two light emitting surfaces of two neighboring light emitting devices is substantially equal to an integer multiple of the first width.

3. The illumination device of claim 2, wherein the distance between the two light emitting surfaces of two neighboring light emitting devices is substantially equals to the first width.

4. The illumination device of claim 2, wherein the first width is between 0.5 mm and 1 mm.

5. The illumination device of claim 1, wherein the optical axes of the first and second optical systems are substantially parallel to each other.

6. The illumination device of claim 1, wherein a position of the light emitting devices of the at least one second group of light emitting devices relative to the optical axis of the second optical system is offset with respect to a position of the light emitting devices of the first group of light emitting devices relative to the optical axis of the first optical system.

7. The illumination device of claim 1, wherein the first array and the second array are arranged side by side along a base line.

8. The illumination device of claim 1, wherein the first and second arrays are arranged along a base line orthogonal to the first and second arrays.

9. The illumination device of claim 1, wherein the first and second optical systems comprise positive lenses, and the first and second arrays are substantially arranged on focus planes of respective positive lenses.

10. The illumination device of claim 1, wherein the first group of light emitting devices is placed on a first circuit board, and the second group of light emitting devices is placed on a second circuit board.

11. The illumination device of claim 1, wherein the first and second groups of light emitting devices are placed on a common circuit board.

12. The illumination device of claim 1, further comprising a control unit configured to selectively activate or deactivate individual light emitting devices of the plurality of light emitting devices.

13. A vehicle headlight comprising illumination device of claim 1, wherein the predetermined distance from the illumination device is between 20 m and 30 m.

14. The vehicle headlight of claim 13, further comprising a control unit configured to selectively activate or deactivate individual light emitting devices of the plurality of light emitting devices.

15. A streetlight comprising illumination device of claim 1, wherein the predetermined distance from the illumination device is between 3 m and 6 m.

16. The streetlight of claim 15, further comprising a control unit configured to selectively activate or deactivate individual light emitting devices of the plurality of light emitting devices.

17. A room lighting device comprising the illumination device of claim 1, wherein the predetermined distance from the illumination device is between 2 m and 4 m.

18. The room lighting device of claim 17, further comprising a control unit configured to selectively activate or deactivate individual light emitting devices of the plurality of light emitting devices.

\* \* \* \* \*